(12) United States Patent
Kayser et al.

(10) Patent No.: US 8,789,391 B2
(45) Date of Patent: Jul. 29, 2014

(54) METHOD AND APPARATUS FOR PRODUCING A CRUCIBLE OF QUARTZ GLASS

(75) Inventors: Thomas Kayser, Leipzig (DE); Walter Lehmann, Leipzig (DE); Hilmar Laudahn, Dessau (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 1222 days.

(21) Appl. No.: 12/319,592

(22) Filed: Jan. 9, 2009

(65) Prior Publication Data
US 2009/0277223 A1    Nov. 12, 2009

(30) Foreign Application Priority Data

Jun. 5, 2008  (DE) .......................... 10 2008 026 890

(51) Int. Cl.
*C03B 20/00*    (2006.01)
(52) U.S. Cl.
USPC .......................................................... 65/33.9
(58) Field of Classification Search
USPC .................................... 65/33.9, 157
See application file for complete search history.

(56) References Cited

U.S. PATENT DOCUMENTS

| | | | |
|---|---|---|---|
| 5,762,672 | A | 6/1998 | Ikeda et al. |
| 6,502,422 | B1 | 1/2003 | Hansen et al. |
| 6,553,787 | B1 | 4/2003 | Akiho et al. |
| 2002/0166341 | A1 | 11/2002 | Shelley et al. |

FOREIGN PATENT DOCUMENTS

| | | |
|---|---|---|
| EP | 0 693 461 A1 | 1/1996 |
| EP | 1 094 039 A1 | 4/2001 |

*Primary Examiner* — Joseph S Del Sole
*Assistant Examiner* — Russell Kemmerle, III
(74) *Attorney, Agent, or Firm* — Tiajoloff and Kelly LLP

(57) ABSTRACT

The invention starts from a method for producing a crucible of quartz glass in that $SiO_2$ inner layer granules are vitrified in a rotating melting mold, which is covered at least in part by a heat shield, in a light gas-containing atmosphere under the action of a plasma to obtain a transparent inner layer, at least part of the light gas being supplied to the melting mold through a gas inlet of the heat shield. In order to form an inner layer with a particularly low bubble content and with minimal efforts in terms of energy and material, it is proposed that in a layer forming step preceding the vitrifying step a granule layer consisting of the $SiO_2$ inner layer granules is formed on the inner wall of the crucible, and that the plasma zone and the heat shield are movable together with the gas inlet and are moved laterally in the direction of the granule layer during the vitrifying step taken for vitrifying the granule layer.

11 Claims, 1 Drawing Sheet

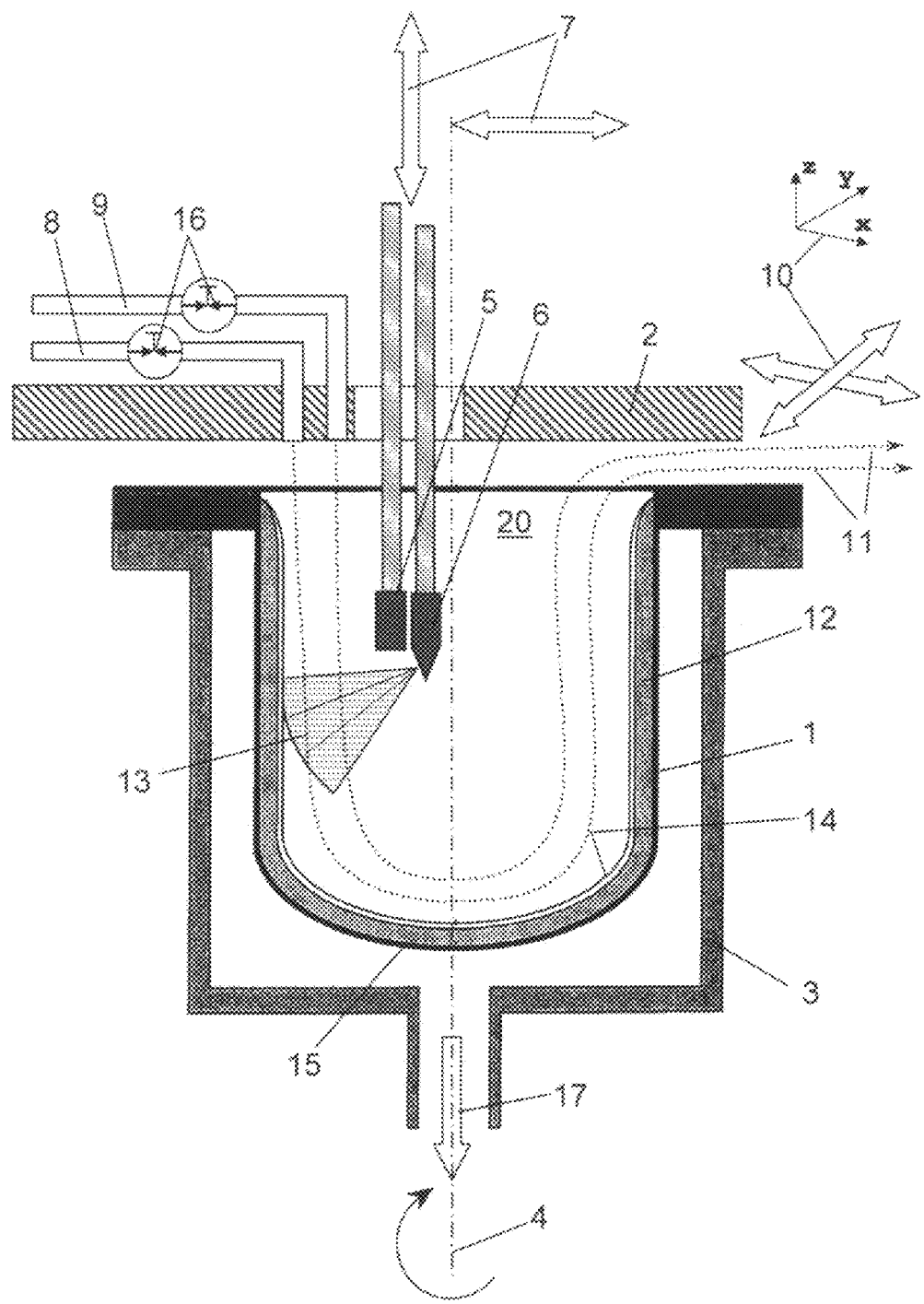

METHOD AND APPARATUS FOR PRODUCING A CRUCIBLE OF QUARTZ GLASS

FIELD OF THE INVENTION

The present invention relates to a method for producing a crucible of quartz glass, the method comprising a method step of vitrifying $SiO_2$ inner layer granules by vitrifying said granules in a melting mold which rotates about an axis of rotation and comprises an inner wall and an upper side opening covered by a heat shield at least in part, under the action of a plasma zone in a light gas-containing atmosphere with formation of a transparent inner layer on a crucible base mold of quartz glass, wherein at least part of the light gas is supplied to the melting mold through a gas inlet of the heat shield.

DESCRIPTION OF THE RELATED ART

Quartz glass crucibles are used for receiving the metal melt while single crystals are pulled according to the so-called Czochralski method. In this pulling process, the quartz glass crucible is subjected to high mechanical, chemical and thermal loads for several hours. To mitigate the corrosive attack of the metal melt and, in conjunction therewith, the release of impurities from the crucible wall, the inner layer of the crucible that is in contact with the metal melt should be as homogeneous and free of bubbles as possible.

The low-bubble transparent inner layer is often formed by the following method: A quartz-glass base mold of the crucible is produced in a metallic melting mold and the inner layer is applied to the inner wall of the base mold in that an electric arc (plasma) is ignited in the melting mold and $SiO_2$ granules are introduced by being spread into the rotating base mold by means of a spreading tube terminating above the electric arc. The granules are molten in the plasma and flung onto the inner wall of the base mold under the action of the pressure produced by the plasma and are deposited there and immediately vitrified into the transparent inner layer, whereas the base mold remains mainly opaque. In the following, the step of spreading $SiO_2$ granules into the melting mold and exposing the granules at the same time to plasma is referred to as "spreading method".

Small residual bubbles, which normally contain nitrogen deriving from air, may remain in the inner layer. During the intended use of the crucible these bubbles will grow under the action of temperature and pressure and will finally burst so that fragments and other impurities pass into the silicon melt, resulting in a lower yield of dislocation-free silicon single crystal.

It has been suggested that the gas contained in the bubbles should be replaced with the gases helium or hydrogen (these two low molecular weight gases will also be called "light gases" in the following), such gases rapidly diffusing into quartz glass and therefore reducing both bubble formation and bubble growth. For instance, US 2002/0166341 A1 discloses a method for producing a quartz glass crucible with a reduced bubble content in the inner layer, wherein $SiO_2$ granules are introduced into a rotating melting mold and shaped under the action of the centrifugal force as crucible base layer and this layer is subsequently heated and vitrified in an atmosphere containing helium or hydrogen.

EP 1 094 039 A1 discloses a method and an apparatus of the above-mentioned type. Here the opaque base mold of the quartz glass crucible is first produced in the standard way and $SiO_2$ spreading granules are supplied to the interior of the crucible and to the plasma ignited there together with hydrogen (alternatively helium and/or oxygen) for depositing the transparent inner layer by means of an electric arc type spreading method. To this end a double-walled introducing tube is used for granules and gas, the tube projecting into the interior of the crucible at the side relative to the arc electrodes through a heat shield which substantially covers the open upper side of the crucible.

Due to the early treatment with hydrogen, impurities contained in the spreading granules as well as carbon-containing components are to be removed already prior to the fusion of the granules and, together with this, the volume of gases entrapped in the inner layer is to be reduced and bubble growth is to be minimized at the same time.

As a supplement to the hydrogen treatment of the spreading granules, it is suggested that gas residues in the opaque base mold should also be replaced by a rapidly diffusing gas, such as helium. To this end a vacuum method is provided wherein the base mold is tightly sealed by means of a cover prior to the formation of the inner layer, whereupon the interior of the crucible is evacuated and helium is introduced from the outside via the still porous base mold wall. After the gas exchange the cover is removed, the inner wall of the base mold is vitrified on the surface and the vitrified inner wall has formed thereon the inner layer according to the electric arc type spreading method, as explained above.

U.S. Pat. No. 6,502,422 B1 discloses a further vacuum method for producing a quartz-glass crucible. A vacuum melting mold is used having a wall provided with multiple through-holes through which gases can be removed from the inside of the melting mold to the outside by application of a negative pressure. The vacuum melting mold is introduced into an overpressure chamber in which a defined melt atmosphere can be set. After formation of the base mold of $SiO_2$ granules the vacuum melting mold is evacuated and the existing atmosphere is replaced by the "artificial atmosphere" of the overpressure chamber. The gas present in the base mold is here sucked off through the melting mold wall to the outside, with the gas composition in the outflowing gas stream being monitored for detecting the completion of the gas exchange. Helium, hydrogen, oxygen, nitrogen, noble gases, halogens, water vapor, and the like, are named as exchange gases.

In the method known from EP 0 693 461 A1 for producing a quartz glass crucible with a transparent inner layer, a melting mold is used that is rotatable about an axis of rotation and has an open upper side which is covered with a lid including ventilation holes. To form the transparent inner layer, $SiO_2$ granules are supplied in small amounts to the rotating casting mold and deposited on the inner wall of a $SiO_2$ base mold and simultaneously molten by means of a plasma source with formation of the transparent inner layer. Venting is here carried out by means of the ventilation holes in such a way that the high-temperature gas atmosphere escapes from the interior of the melting mold and is replaced by a dust-free atmosphere of "synthetic air".

In the known method the manufacture of a bubble-free inner layer entails a comparatively high consumption of energy and process gases and requires high constructional efforts.

BRIEF SUMMARY OF THE INVENTION

It is the object of the present invention to indicate a method by means of which a quartz glass crucible can be produced with a low-bubble inner layer while keeping the efforts in terms of energy and material as low as possible.

Furthermore, it is the object of the present invention to provide a constructionally simple apparatus for performing the method.

As for the method, this object, starting from the method of the above-mentioned type, is achieved according to the invention in that in a layer forming step preceding the vitrifying step a granule layer consisting of the $SiO_2$ inner layer granules is formed on the inner wall, and that the plasma zone and the heat shield together with the gas inlet are movable at least in a direction perpendicular to the rotation axis and are moved during the vitrification step for vitrifying the granule layer laterally in the direction of the granule layer.

The method according to the invention permits the manufacture of a bubble-free transparent inner layer on a crucible base mold of opaque quartz glass while consuming a comparatively low amount of energy and material. This is mainly possible due to the combination of the following measures.

On the one hand the "electric-arc spreading technique" as described in detail above is not used for forming the inner layer, as is the case in the generic method, but a procedure is used wherein first of all, i.e. prior to the vitrification step, a porous granule layer is formed from the inner layer granules and said layer is subsequently vitrified in the vitrification step. The formation of the granule layer from the $SiO_2$ inner layer granules on the inner wall is carried out for instance by using a template by means of which the inner layer granules are pressed onto the inner wall and/or under the action of gravitation while the melting mold is rotating. The granule layer is applied either directly to the inner wall of the melting mold or to the inner wall of a crucible base mold already existing there. In the first-mentioned case the $SiO_2$ inner layer granules serve both the manufacture of the crucible base mold of opaque quartz glass and the formation of the inner layer of transparent quartz glass. In the last-mentioned case, i.e. in the case where a crucible base mold is already present, it is just present as a mechanically pre-compacted loose granule layer or as an at least partly sintered or vitrified molding of $SiO_2$ granules. The inner wall is defined by a straight or curved bottom, a side wall and a transition area between bottom and side wall. At least a portion of the inner wall is provided with the $SiO_2$ inner layer granules and then vitrified into the transparent inner layer. In comparison with the "spreading technique" a shorter melting period and with this a lower amount of energy is needed in this procedure for the formation of a transparent layer having a predetermined thickness.

As a further measure it is intended in the method according to the invention that the plasma zone and the at least one gas inlet of the heat shield are movable in a direction perpendicular to the axis of rotation of the melting mold and are moved during the vitrification of the granule layer at least once towards the previously formed granule layer. The gas inlet serves the supply of light gas or of a gas mixture containing a light gas into the melting mold. Owing to the movement in horizontal direction plasma zone and gas supply can be moved close to the areas of the granule layer to be respectively vitrified (i.e. bottom, side wall or transition area), and these are locally heated and vitrified by the plasma zone, which also reduces the amount of energy needed for the vitrifying process. Upon displacement of the plasma zone also in the direction of the rotation axis, a close-contour follow-up movement is possible during vitrification of the granule layer. Attention must here be paid that due to the rotation of the crucible at the predetermined height position of the plasma zone an annular vitrification area is each time obtained that can be displaced through a corresponding upward and downward movement of the plasma zone over the whole inner wall. The displacement of the plasma zone can be accomplished through a corresponding movement of the plasma-generating electrodes, by tilting the electrodes or by way of the energy supplied to the electrodes.

What is also important is the use of a horizontally movable heat shield (the horizontal movement shall also be called "lateral deflection" in the following), which makes it possible to move the gas inlet for the light gas close to the plasma zone, so that the light gas can be locally supplied to the respectively current vitrification zone. The local supply effects a particularly efficient exploitation of the light gas used, thereby reducing gas consumption. The heat shield and the gas inlet are made to follow the current vitrification zone during the vitrification step at least once, but preferably continuously or from time to time. The heat shield covers the open upper side of the melting mold not in a tight way, but in such a way that a gas flow out of the melting mold is enabled during vitrification at least from time to time.

The vitrification step is preferably carried out in an open flow system.

The open system permits not only a gas flow within the melting mold, but also allows a gas flow directed out of the melting mold. This facilitates the discharge of contaminated gas or evaporated material out of the melting mold. Undesired deposits are thereby prevented and impurities are reduced. An open flow system is e.g. achieved in that a gap through which gas can escape from the melting mold remains between the upper side of the melting mold and the heat shield.

Furthermore, it has turned out to be advantageous when the light gas is supplied to the melting mold continuously as a controlled light-gas stream.

Gas flow control for the light-gas stream permits a position- or time-dependent actuation with light gas during vitrification of the inner layer, which contributes to a further reduction of the gas consumption. This applies equally to possible further gases supplied to the melting mold via the heat shield. For instance, during vitrification in the bottom area of the inner wall, where there is rather the risk that $SiO_2$ granules that are hardly compacted are blown away under the action of a gas stream, a smaller gas stream is desired there than in the area of the side wall.

Preferably, the heat shield is configured such that the upper side opening of the melting mold remains covered also upon a lateral deflection of the heat shield.

The heat shield is larger than the opening of the melting mold, so that it will always project beyond the upper side opening also upon deflection. The maximum deflection of the heat shield (or the gas inlet) that is relevant in practice follows from the distance between the center axis and the side wall of the melting mold, i.e. the opening radius of the crucible to be produced. Since even in these two extreme positions of the gas inlet (central position and position above the side wall) the open upper side of the melting mold, in a top view on the heat shield, remains covered, a stable and reproducible gas flow is ensured within and out of the melting mold.

In this respect it has also turned out to be advantageous when the plasma zone and the heat shield are moved in synchronism.

As a result of the synchronous movement, changes in the gas flow inside the crucible are also avoided, which has an advantageous effect on the constancy and reproducibility of the vitrification process.

In a particularly preferred variant of the method it is intended that the light gas is blown into the plasma zone via the gas inlet of the heat shield.

The blowing of the light gas directly into the plasma zone results in a particularly efficient exploitation of the expensive light gas because said gas is supplied by the pressure of the plasma directly to the area to be vitrified.

It has also turned out to be advantageous when a gas enriching process takes place between the layer forming step and the vitrifying step, wherein the atmosphere in the melting mold is enriched by the atmosphere containing the light gas.

Thanks to this gas enrichment prior to vitrification, the content of air (and nitrogen, respectively) in the $SiO_2$ granule layer is reduced, so that the use of light gas is more efficient during vitrification and the inner layer produced in this way shows a particularly low bubble density.

In this respect it has also turned out to be advantageous when the gas enrichment process comprises the supply of light gas into the melting mold via the gas inlet of the heat shield and the application of a vacuum to an outer wall of the crucible base mold.

Due to the application of a negative pressure, starting from the outer wall, gas existing in the granule layer and optionally also the gas existing in the wall of a porous crucible base mold is sucked off directly to the outside and is replaced with light gas through the atmosphere following from the inside of the melting mold.

Moreover, it has turned out to be advantageous when during vitrification a vacuum is applied to the outer wall of the crucible base mold.

During vitrification under vacuum a sealing layer is formed in the area where the plasma zone acts on the inner wall of the $SiO_2$ granule layer, said sealing layer preventing any further action of the vacuum into the interior of the melting mold, whereby the transparent inner layer is gradually formed. As soon as the transparent inner layer has been formed, the vacuum (the negative pressure) can be switched off or reduced.

Preferably, the atmosphere containing the light gas contains helium and not more than 50% by vol. of oxygen, preferably in the range of 10-30% by vol. of oxygen.

Due to the oxygen content of the vitrification atmosphere, combustion of graphite and conversion to CO and $CO_2$ are observed when graphite electrodes are used for igniting the plasma. It has been found that this may have an advantageous impact on the quality of the inner layer of the quartz glass crucible to be produced.

Moreover, a melting mold atmosphere that, apart from helium, also contains enough oxygen has the advantage that it can be used as a breathing gas, so that respirator masks and other safety measures, for instance a process chamber protected from the environment and used for accommodating the melting mold, are not needed in the environment of the melting mold. Moreover, process parameters taken from conventional crucible manufacture with a vitrification of the inner layer in air can be adopted and adapted more easily.

In a preferred variant of the method, it is intended that the atmosphere containing the light gas is created through the controlled supply of a gas mixture consisting of light gas and oxygen.

The use of a previously produced gas mixture offers the advantage that the gas composition is constant in time independently of pressure or temperature changes or variations in the gas flow control and that the number of the needed gas flow controllers is smaller than in the case of an individual gas flow control for each type of gas. The gas mixture is e.g. set before by means of a static mixer which permits high throughputs (e.g. up to 600 $m^3/h$).

In an alternative and equally preferred variant of the method, it is intended that the atmosphere containing the light gas is generated by supplying light gas and oxygen in a controlled manner.

The individual gas flow control for each type of gas is more flexible than the use of a previously set gas mixture and permits, above all, also changes in the atmosphere composition inside the melting mold in response to the position of the current vitrification range or the time phase in the vitrification process.

As for the apparatus, the above-indicated object, starting from an apparatus comprising the features of the above-indicated type, is achieved according to the invention in that the plasma source and the heat shield together with the gas inlet are configured to be movable at least in a direction perpendicular to the axis of rotation.

The apparatus of the invention serves to perform the above-illustrated method. It is substantially distinguished in that both the plasma source and the heat shield with the at least one gas inlet are movable in a direction perpendicular to the axis of rotation of the melting mold, i.e. horizontally, so that the plasma source and the plasma zone produced by it and the gas supply are moved close to the regions of the granule layer to be respectively vitrified and these can be locally heated and vitrified by the plasma zone.

This will considerably reduce the amount of energy needed for vitrification and entail a particularly efficient exploitation of the light gas, as has been described in detail above with reference to the discussion of the method according to the invention.

Advantageous designs of the apparatus according to the invention become apparent from the sub-claims. Insofar as configurations of the apparatus indicated in the sub-claims imitate the procedures mentioned in sub-claims regarding the method according to the invention, reference is made for a supplementary explanation to the above observations made on the corresponding method claims. The configurations of the apparatus according to the invention as mentioned in the remaining sub-claims shall be explained in more detail in the following.

Advantageously, a gap is provided between the heat shield and the upper side opening.

The heat shield covers the opening while leaving a completely or partly surrounding gap relative to the upper edge of the melting mold. This measure permits an "open system" and thus a gas flow both within the melting mold and a gas flow directed out of the melting mold. This facilitates the discharge of contaminated gas or evaporated material from the melting mold, and undesired deposits are prevented and impurities reduced.

It has turned out to be useful when a vacuum device is provided, by means of which a vacuum is producible on an outer wall of the melting mold.

The vacuum device facilitates the exchange of gas from the interior of the melting mold, the wall of the crucible base mold and from the $SiO_2$ granule layer, and it helps to produce a low-bubble quartz glass crucible. The vacuum device can be used during vitrification of the inner layer and also during a gas enrichment and exchange process preceding the vitrification step.

It has turned out to be advantageous when the gas inlet of the heat shield is provided with a flexible pipe for the supply of light gas.

The flexible pipe simplifies the lateral deflection of the heat shield and of the at least one gas inlet.

BRIEF DESCRIPTION OF THE DRAWINGS

The invention shall now be explained in more detail with reference to embodiments and a drawing. As the sole FIGURE, FIG. 1 shows a melting apparatus suited for performing the method of the invention, in a schematic illustration.

DETAILED DESCRIPTION OF THE INVENTION

The melting apparatus according to FIG. 1 comprises a melting mold 1 of metal with an inner diameter of 75 cm, the mold 1 resting with an outer flange on a support 3. The support 3 is rotatable about the central axis 4. A cathode 4 and an anode 6 (electrodes 5; 6) of graphite which, as illustrated by way of directional arrows 7, are movable inside the melting mold 1 in all spatial directions project into the interior 20 of the melting mold 1.

A heat shield 2 in the form of a water-cooled metal plate having a thickness of 10 mm, which comprises a central through-hole through which the electrodes 5, 6 protrude into the melting mold 1 projects beyond the open upper side of the melting mold 1. The heat shield 2 is connected to a gas inlet 8 for a gas mixture of helium and oxygen and to a gas inlet 9 for pure helium, which inlets are configured as flexible pipes into which gas flow controllers 16 (MFC) are inserted. A venting gap with a width of 50 mm is provided between the melting mold 1 and the heat shield 2 (FIG. 1 shows this dimension and all of the other dimensions of the apparatus only schematically, not true to scale). The heat shield 2 is horizontally movable (in x- and y-direction) in the plane located above the melting mold 1, as is outlined by the directional arrows and the coordinate plane 10.

The space between the support 3 and the melting mold can be evacuated by means of a vacuum device, which is represented by the directional arrow 17. The melting mold 1 comprises multiple passages 15 (which in FIG. 1 are only symbolized in the bottom area) through which vacuum can act on the outside of the mold 1 to the inside.

The manufacture of a 28-inch quartz glass crucible according to the invention shall now be explained in more detail with reference to a preferred embodiment.

In a first method step, crystalline granules of natural quartz sand, which has been cleaned by means of hot chlorination, with a preferred grain size ranging from 90 μm to 315 μm, are filled into the melting mold rotating about its longitudinal axis 4.

Under the action of the centrifugal force and by means of a mold template, a rotation-symmetrical crucible-shaped layer 12 of mechanically compacted quartz sand is formed on the inner wall of the melting mold 1. The mean layer thickness of the layer 12 is 12 mm.

In a second method step, a granule layer 14 of synthetically produced quartz glass powder is formed on the inner wall of the quartz sand layer 12, also by using a mold template and under continued rotation of the melting mold 1. The mean layer thickness of the layer 14 is also 12 mm.

In a third method step, the air contained in the granule layers 12 and 14 is enriched with a helium-containing process gas. To this end the heat shield 2 is positioned above the opening of the melting mold 1 and the air inside the melting mold 1 is pumped off by means of the vacuum device 17 via the gas-permeable granule layers 12 and 14 in that it is drawn off through the granule layers 12, 14 to the outside. At the same time, a mixture of helium and 20% oxygen is introduced into the interior 20 of the melting mold 1 via the gas inlet 8 of the heat shield 2. After a period of about 10 minutes, the enriching process with the helium-containing process gas is terminated.

In a fourth method step, the granule layers 12 and 14 are vitrified zone by zone. To this end and after the completion of the gas enrichment process the electrodes 5; 6 are introduced through the central opening of the heat shield 2 into the interior 20, and an electric arc, which is marked in FIG. 1 by the plasma zone 13 as an area shown against a gray background, is ignited between the electrodes 5; 6 in the melting mold atmosphere consisting of helium and oxygen. In this process a constant and controlled stream of the He/$O_2$ mixture of 300 l/min is supplied to the interior 20 via the feed line 8. Inside the interior 20, a stable gas flow is generated, which is shown in FIG. 1 by the dotted lines 11 and exits out of the melting mold interior 20 via the gap between heat shield 2 and melting mold 1.

For vitrifying the granule layers 12; 14 in the area of the side wall the heat shield 2 together with the gas inlet 8 and the electrodes 5; 6 are brought into a lateral position (as shown in FIG. 1). For the vitrification of the granule layers 12; 14 in the area of the bottom, the heat shield 2 together with the gas inlet 8 is moved into a central position, with the electrodes 5; 6 being also moved into a central position and lowered downwards.

It is thereby possible to reach all areas of the granule layers 12; 14, i.e. the bottom, the substantially cylindrical wall, and the curved transition area between bottom and wall with both the plasma zone 13 and the process gas (80 He/20$O_2$). The movability of the heat shield 2 permits a horizontal adjustment of the gas supply 8, which enables the process gas to be blown directly into the plasma zone 13, whereby the process gas is optimally exploited and the reproducibility of the method is improved. In addition, the gas stream can be adjusted freely, which permits a stable gas flow inside the melting mold 1 and out of the melting mold. It is thereby ensured that the supplied process gas reaches all areas of the granule layers 12; 14 in which vitrification is in the process of being carried out.

During vitrification a sealing layer is rapidly forming on the inner surface of the granule layer 12, said sealing layer separating the non-fused portions of the crucible wall from the atmosphere in the melting mold interior 20. Since the gas mixture of helium and oxygen is still pumped off through the porous granule layers 12 and 14, a negative pressure of about 200 mbar (absolute) is generated. As a consequence, a dense inner layer is formed which shows hardly any bubbles and is therefore transparent. The thin and non-transparent sealing layer which covers the transparent inner layer is removed in the further course of the process by the action of the plasma 13 at least in part and is eliminated completely, if necessary, at the end of the manufacturing process by way of sandblasting.

As soon as the vitrified inner layer has reached a thickness of about 2.5 mm, the suction capacity of the vacuum device 17 is reduced via a throttle valve (not shown in FIG. 1) to such an extent that the pressure prevailing in the areas of the granule layers 12; 14 that have not been vitrified yet rises to 900 mbar (absolute pressure). The gas needed for this originates particularly from the interior 20 of the melting mold 1, from which it exits through the non-molten areas of the granule layers 12; 14 through the penetrations 15 of the mold wall. The gas composition in the non-fused areas of the granule layers 12; 14 can thus be adjusted via the atmosphere in the interior 20 until these areas are also fused into opaque quartz glass. The melting process will be completed before the melt front reaches the inner wall of the melting mold 1.

The inner surface of the quartz glass crucible produced in this way is thus formed by a smooth, vitreous and low-bubble inner layer of synthetic $SiO_2$ which is firmly connected to an outer layer of opaque quartz glass. The inner layer formed in this way is moreover distinguished by a low bubble growth when the crucible is used in the intended way.

The invention claimed is:

1. A method for producing a crucible of quartz glass, said method comprising:
   a step of vitrifying $SiO_2$ inner layer granules in a melting mold that rotates about an axis of rotation and comprises an inner wall,
   said melting mold having an upper side opening covered by a heat shield,
   said vitrifying being under the action of a plasma zone in atmosphere containing a light gas so as to form a transparent inner layer on a crucible base mold of quartz glass, at least part of the atmosphere containing the light gas being supplied to the melting mold through a gas inlet of the heat shield,
   wherein, in a layer-forming step preceding the vitrifying step, a granule layer of the $SiO_2$ inner layer granules is formed on the inner wall, and
   wherein the plasma zone and the heat shield together with the gas inlet are supported so as to be movable at least in a direction perpendicular to the rotation axis and are moved laterally in the direction of the granule layer during the vitrifying step so as to vitrify the granule layer; and
   wherein the upper side opening of the melting mold remains covered when the heat shield is moved laterally.

2. The method according to claim 1 wherein the vitrifying step is carried out in an open flow system allowing a gas flow directed out of the melting mold.

3. The method according to claim 1 wherein the light gas is supplied to the melting mold continuously as a controlled gas flow.

4. The method according to claim 1 wherein the light gas is blown via the gas inlet of the heat shield into the plasma zone.

5. The method according to claim 1 wherein the plasma zone and the heat shield are moved in synchronism.

6. The method according to claim 1 wherein a gas enriching operation in which the atmosphere in the melting mold is enriched by the light gas-containing atmosphere is provided between the layer-forming method step and the vitrifying method step.

7. The method according to claim 6 wherein the gas enrichment process comprises supply of light gas into the melting mold via the gas inlet of the heat shield and exposure of an outer wall of the crucible base mold to a vacuum.

8. The method according to claim 1 wherein during vitrification the outer wall of the crucible base mold is exposed to a vacuum.

9. The method according to claim 1 wherein the light gas-containing atmosphere contains helium and not more than 50% by vol. of oxygen.

10. The method according to claim 9 wherein the light gas-containing atmosphere contains oxygen in a range of 10 to 30% by vol. and helium.

11. The method according to claim 1 wherein the light gas-containing atmosphere is generated by a controlled supply of light gas and of oxygen.

* * * * *